United States Patent [19]

Landis et al.

[11] Patent Number: 4,479,698
[45] Date of Patent: Oct. 30, 1984

[54] LIGHT EMITTING ASSEMBLY AND A METHOD OF MAKING SAME

[75] Inventors: William C. Landis, Lancaster; Paul Nyul, New Holland, both of Pa.

[73] Assignee: RCA Corporation, New York, N.Y.

[21] Appl. No.: 379,097

[22] Filed: May 17, 1982

[51] Int. Cl.³ .............................................. G02B 7/26
[52] U.S. Cl. ............................... 350/96.20; 350/96.17
[58] Field of Search ............... 350/96.15, 96.17, 96.18, 350/96.20

[56] References Cited

U.S. PATENT DOCUMENTS

| | | | |
|---|---|---|---|
| 3,560,275 | 2/1971 | Kressel et al. | 148/1.5 |
| 3,829,195 | 8/1974 | Rawson | 350/96 R |
| 3,952,265 | 4/1976 | Hunsperger | 350/96.11 |
| 4,065,203 | 12/1977 | Goell et al. | 350/96 R |
| 4,107,242 | 8/1978 | Runge | 264/1 |
| 4,169,656 | 10/1979 | Hodge | 350/96.15 |
| 4,182,545 | 1/1980 | Greer | 350/96.20 |
| 4,186,994 | 2/1980 | Denkin et al. | 350/96.17 |
| 4,215,319 | 7/1980 | Botez | 372/46 |
| 4,237,474 | 12/1980 | Ladany | 350/96.2 |
| 4,378,954 | 4/1983 | Baker | 350/96.2 |
| 4,394,061 | 7/1983 | Schroeder | 350/96.2 |

FOREIGN PATENT DOCUMENTS 3004379 8/1980 Fed. Rep. of Germany ..... 350/96.2

Primary Examiner—John D. Lee
Assistant Examiner—Brian M. Healy
Attorney, Agent, or Firm—Birgit E. Morris; Donald S. Cohen; William J. Burke

[57] ABSTRACT

A light emitting assembly comprising a light emitting device, an optical fiber and an optical coupling medium which is contacted to both a facet of the light emitting device and an end face of the fiber and whose maximum diameter is comparable to the diameter of the end face of the fiber. The invention is also a method of making this light emitting assembly which comprises positioning the end face of the optical fiber adjacent to the emitting portion of the facet, interposing an optical coupling medium between the facet and the end face of the fiber and increasing the space between the facet and the end face of the fiber until the maximum amount of light is coupled into the fiber.

8 Claims, 2 Drawing Figures

LIGHT EMITTING ASSEMBLY AND A METHOD OF MAKING SAME

The invention relates to an improved light emitting assembly comprising a light emitting device and an optical fiber with an optical coupling medium therebetween and a method of making this assembly.

BACKGROUND OF THE INVENTION

An important parameter in optical communications systems is the coupling efficiency of light emitted by a light emitting device, such as a semiconductor light emitting diode or laser, into an optical fiber. Efficient coupling of light into the fiber occurs when an end of the fiber is brought very close to and aligned with the emitting portion of the facet of the light emitting device. To improve the efficiency of the coupling, an optical coupling medium such as a refractive index matching material which may also be a cement, is inserted between the end of the fiber and the emitting facet. Such an index matching material reduces reflections at the facet-air and air-fiber interfaces, thereby increasing the amount of light coupled into the fiber and reducing the intensity of spurious reflected beams which may be coupled into the fiber. Cementing the fiber to the facet also maintains the alignment of the fiber and the emitting facet thereby improving the reliability of the assembly. At the present time assemblies of light emitting devices and optical fibers perform with adequate efficiency. However, further improvements in the efficiency of the coupling of light into an optical fiber are clearly desirable to improve the overall system performance.

SUMMARY OF THE INVENTION

The invention is an improved light emitting assembly wherein the improvement comprises an optical coupling medium whose maximum diameter is comparable to that of the end face of the optical fiber and wherein the spacing between the emitting facet and the end face of the fiber is between about 0.5 and about 3 times the diameter of the fiber.

The invention also includes a method of fabricating the improved light emitting assembly of the invention which includes aligning the fiber to the emitting portion of the facet, interposing an optical coupling medium between the facet and the end face of the fiber and then increasing the spacing between the facet and the end face until the amount of light coupled into the fiber is a maximum and hardening the optical coupling medium. The optical coupling medium thus formed has a diameter comparable to that of the end face and, in effect, serves as an optical fiber contacted to the facet of the light emitting device.

DETAILED DESCRIPTION OF A PREFERRED EMBODIMENT

Figure 1:
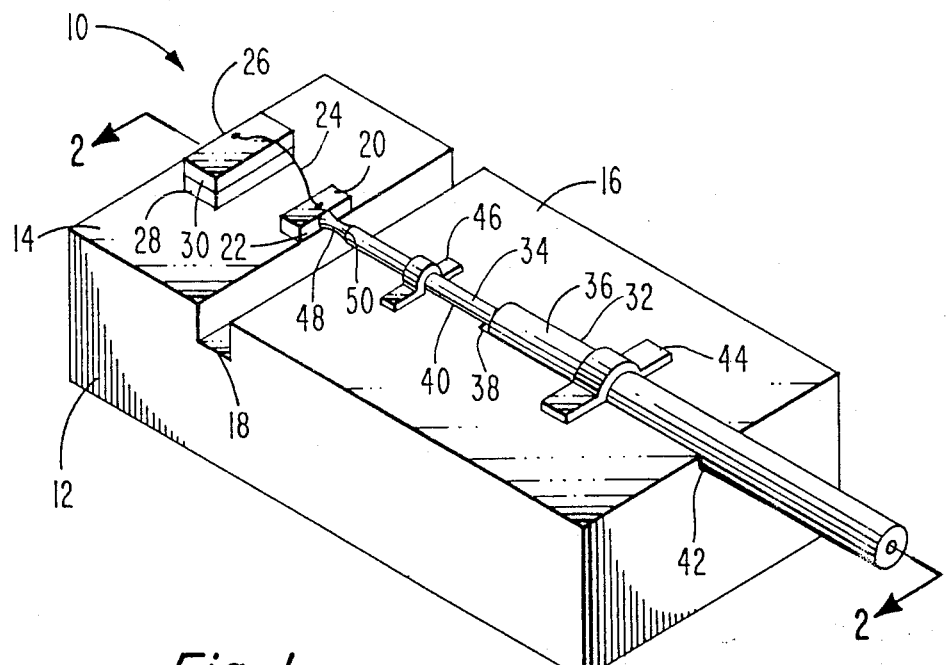
FIG. 1 is a perspective view of a light emitting assembly of the invention.
Figure 2:
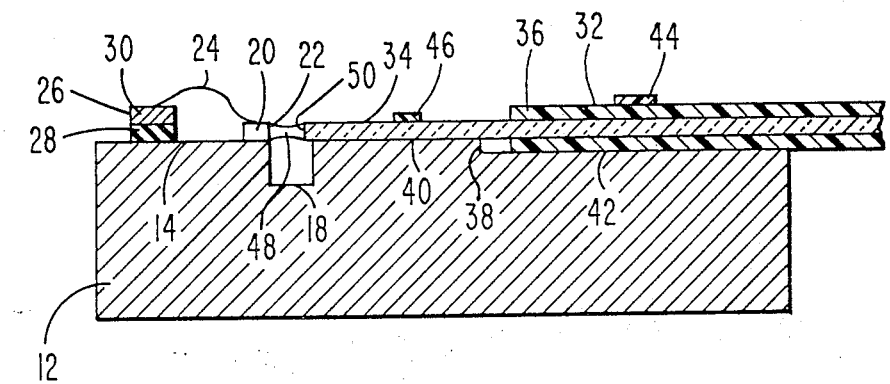
FIG. 2 is a cross sectional view of the light emitting assembly of the invention along the line 2—2 of FIG. 1.

In the FIGURES the light emitting assembly 10 includes a header 12 having a light emitting device mounting surface 14 and an optical fiber mounting surface 16 with a groove 18 therebetween. A semiconductor light emitting device 20 is mounted on the mounting surface 14 with a light emitting facet 22 adjacent and substantially perpendicular to an edge of the groove 18. The semiconductor light emitting device 20 may be a light emitting diode such as that disclosed by Kressel et al. in U.S. Pat. No. 3,560,275 or a semiconductor laser such as that disclosed by Botez in U.S. Pat. No. 4,215,319. One electrical contact of the light emitting device 20 is electrically connected to the header 12 by soldering while the second electrical contact is connected via a wire 24 to a contact pad 26 composed of an electrical contact 30 which is electrically isolated from the surface 14 by an insulator 28. External electrical connections to the semiconductor light emitting device 20 are then made by connection to the header 12 and the contact pad 26. An optical fiber cable 32 composed of an optical fiber 34 surrounded by a protective sheath 36 is mounted in a recess 38 in the optical fiber mounting surface 16. The axis of the recess 38 is substantially perpendicular to the emitting facet 22 of the semiconductor light emitting device 20. The recess 38 is composed of a first portion 40 whose width and depth are such that the optical fiber 34 can be positioned therein so that its axis is coaxial with the axis of a light beam emitted from the emitting facet, and a second portion 42 whose width and depth are sufficient to support the optical fiber cable 32. The diameter of the optical fiber 34, including its core and cladding, is typically about 40 to 500 micrometers, and the diameter of the optical fiber cable 32 as a whole is typically greater than 2 millimeters. The optical fiber cable 32 and the optical fiber 34 are cemented to the optical fiber mounting surface 16 using pads of cement, 44 and 46 respectively, composed of materials such as an epoxy resin.

An optical coupling medium 48 extends between a portion of the facet 22 of the light emitting device 20 from which light is emitted and an end face 50 of the optical fiber 34. The optical coupling medium 48 has a maximum diameter comparable to and typically equal to the diameter of the end face 50. The diameter of the optical coupling medium 48 is a maximum at the facet 22 and the end face 50 and tapers in decreasing thickness away from the fact 22 and the end face 50, producing a "bow-tie" shape in the optical coupling medium 48. The spacing between the facet 22 and the end face 50, i.e. the length of the optical coupling medium 48 may be between about 0.5 and 3 times and is typically between about 1 and 2 times the diameter of the optical fiber 34.

The optical coupling medium 48 is composed of a material which is substantially transparent at the wavelength of the light emitted by the light emitting device 20 and adheres well to the facet 22 and the end face 50. Typically, this material is a UV curing epoxy such as Norland Optical Adhesive Numbers 61 and 65 (Norland Products, Inc., New Brunswick, N.J. 08902). These epoxies are preferred because their fast curing time reduces the possibility of sagging of the optical medium prior to the hardening.

The optical coupling medium 48 is formed by placing a drop of the epoxy or other material on the end face 50 and bringing the end face 50 of the optical fiber 34 into a close proximity to the light emitting portion of the facet 22 until the material contacts the facet 22. The fiber is then drawn back from the facet while monitoring the amount of light coupled into the fiber from the light emitting device 20 until it is a maximum. The amount of light so coupled is observed to increase to a maximum value then decrease with increasing spacing between the facet 22 and the end face 50. The optical coupling medium 48, in effect, forms an additional light pipe which, upon hardening, is cemented to both the facet 22 and the end 50. Light emitted into the optical coupling medium will tend to be guided by the optical coupling medium into the end of the fiber 34. Thus, offsets in the alignment between the emitting portion of the facet and the end face of the fiber will be compensated for by the guiding effect. In contrast, simply positioning the fiber end close to the emitting portion of the facet and placing of a drop of an optical coupling medium between the facet and the end face will provide little if any such guidance to the emitted light beam.

The optical fiber 34 is typically composed of a core surrounded by a cladding layer. Light emitting assemblies of the invention were fabricated using two types of fibers: the first had a core diameter of between 200 and 300 micrometers with the overall diameter of the optical fiber being between 400 and 450 micrometers greater; the second had a core diameter of about 50 micrometers and an overall diameter between about 100 and 150 micrometers. If the cladding is a plastic material it is preferably removed from the portion of the optical fiber which extends over the groove 18. We found that for light emitting assemblies of the invention using the first type of fiber the average increase in the power coupled into the optical fiber was about 15% while for the second type of fiber the increase was about 4% as compared to inserting an optical coupling medium between a closely spaced facet and end face. This difference in the increase in coupling efficiency is due to the fact that the diameter of the core of the first type of fiber is a much larger fraction of the overall fiber diameter than for the second type of fiber and therefore a large fraction of the coupled light enters the core and propagates through the fiber as opposed to entering the cladding and being lost.

We claim:

1. In a light emitting assembly comprising a semiconductor light emitting device having an emitting facet, an optical fiber positioned so that light emitted therefrom enters an end face of said fiber and an optical coupling medium between said facet and said end face;

the improvement comprising said optical coupling medium extending between said facet and said end face, having a maximum diameter which is comparable to the diameter of said fiber and tapering in decreasing thickness from said facet and said end face and wherein the spacing between said facet and said end face is between about 0.5 and about 3 times the diameter of said fiber.

2. The light emitting assembly of claim 1 wherein the spacing between said facet and said end face is between about 1 and about 2 times the diameter of said fiber.

3. The light emitting assembly of claim 2 wherein said optical coupling medium is a UV curing epoxy resin.

4. A method of fabricating a light emitting assembly which comprises the steps of:

mounting a light emitting device on a header;

placing an optical coupling medium on an end face of an optical fiber;

positioning said end face adjacent to a light emitting facet of said device so that said optical coupling medium contacts said facet;

increasing the spacing between said facet and said end face until said optical coupling medium tapers in decreasing thickness from said facet and said end face and a maximum amount of light is coupled into said end face; and hardening said optical coupling medium.

5. The method of claim 4 wherein the step of increasing the spacing forms an element whose maximum diameter is comparable to the diameter of said fiber.

6. The method of claim 5 wherein the spacing between said facet and said end face is between about 0.5 and 3 times the diameter of said fiber.

7. The method of claim 6 wherein the spacing between said facet and said end face is between about 1 and 2 times the diameter of said fiber.

8. The method of claim 4 wherein the optical coupling medium is composed of an epoxy resin and the step of hardening said medium comprises exposing said medium to ultraviolet radiation.

* * * * *